United States Patent [19]

Klatskin et al.

[11] 4,080,722
[45] Mar. 28, 1978

[54] METHOD OF MANUFACTURING SEMICONDUCTOR DEVICES HAVING A COPPER HEAT CAPACITOR AND/OR COPPER HEAT SINK

[75] Inventors: Jerome Barnard Klatskin, Princeton Junction; Arye Rosen, Cherry Hill, both of N.J.

[73] Assignee: RCA Corporation, New York, N.Y.

[21] Appl. No.: 668,906

[22] Filed: Mar. 22, 1976

[51] Int. Cl.² .................................................. B01J 17/00
[52] U.S. Cl. ...................................... 29/580; 29/589; 29/591; 204/15
[58] Field of Search ...................... 29/580, 589, 591; 204/15

[56] References Cited

U.S. PATENT DOCUMENTS

| | | | |
|---|---|---|---|
| 3,462,829 | 8/1969 | Lutz | 29/591 |
| 3,535,773 | 10/1970 | Bakker | 29/580 |
| 3,579,815 | 5/1971 | Gentry | 29/580 |
| 3,795,045 | 3/1974 | Dumas | 29/580 |
| 3,897,627 | 8/1975 | Klatskin | 29/591 |
| 3,932,226 | 1/1976 | Klatskin | 29/589 |

*Primary Examiner*—W. Tupman
*Attorney, Agent, or Firm*—H. Christoffersen; B. E. Morris; A. Stephen Zavell

[57] ABSTRACT

A metal film is deposited on both sides of a semiconductor wafer. A conductive support layer, e.g. gold, is deposited on one of the metal film layers. Using standard procedures, the semiconductor material is then etched to form a plurality of semiconductor devices on the support. A photoresist is next applied over the device side of the support. Windows are opened into the photoresist above each of the devices. A gold wire is attached near the edge of each device so that the devices are each electrically connected in parallel to all of said devices and to said support. A copper heat capacitor is now plated on each device. The gold wires and the photoresist are removed, leaving a copper heat capacitor on the semiconductor device. A copper heat can be formed on the device, with or without formation of the copper heat capacitor, but always after formation of the device per se.

11 Claims, 10 Drawing Figures

4,080,722

METHOD OF MANUFACTURING SEMICONDUCTOR DEVICES HAVING A COPPER HEAT CAPACITOR AND/OR COPPER HEAT SINK

BACKGROUND OF THE INVENTION

The Government has rights in this invention pursuant to Contract No. DAAB07-74-C-0180 awarded by the Department of the Army.

Some semiconductor devices, such as the trapatt diode, require a heat capacitor to remove heat produced during the long pulse operation of the device. One material eminently suitable for such use as a heat capacitor is copper. Manufacturing such devices by first plating a copper layer over an appropriately doped semiconductor body and then etching with acid to form the device is not feasible, because the copper present during the etch phase in silicon or gallium arsenide device manufacture would dissolve in the acidic solution used in the device formation. The dissolved copper would contaminate the exposed junction, shorting out the junctions and reducing the yield of semiconductor devices.

It would accordingly be desirable to devise a process for plating a copper heat capacitor on the top of a diode or other semiconductor device, either with or without a copper heat sink on the bottom of the device, after the "etch phase" has been completed. Kawamoto et al, PCA Review pp. 378–79, September, 1974, describes a process wherein a piece of copper was soldered onto the top gold contact of individual diodes to provide a copper heat capacitor thereon. The present invention provides a simplified process wherein a plurality of diodes or other semiconductor devices are each provided simultaneously with a copper heat capacitor obviating the soldering of individual copper heat capacitors on each device.

It is sometimes desired to form a semiconductor device with a copper heat sink only. There are, however, a great number of rejects, in the conventional system of depositing a copper layer on the gold support before etching the devices. The rejects result from contamination of the exposed junction, differential stress characteristics, etc. The present process obviates this difficulty.

SUMMARY OF THE INVENTION

A method of manufacturing semiconductor devices having a copper heat capacitor thereon includes the following: a metal film is first deposited on both sides of an appropriately doped semiconductor wafer. Next, a conductive support layer is deposited on the metal film on one side of the semiconductor wafer. The semiconductor wafer is now etched to form a plurality of semiconductor devices, e.g. diodes, on the conductive support. A masking material, such as a positive photoresist, is then placed over the entire device side of the gold support. Windows are opened into the masking material above each device. A gold wire is attached near the edge of each device so that each is electrically connected in parallel to all other devices and to the gold support. A copper heat capacitor is then plated on each device. Both the gold wires and the masking material are removed.

When desired, a copper heat sink can also be formed below each device with or without producing the copper heat capacitor.

DETAILED DESCRIPTION

Although the detailed description of the method of the present invention relates to the manufacture of a plurality of silicon diodes, the method is equally applicable to the manufacture of semiconductor devices formed from other semiconductor materials, such as germanium, or a III–V material, such as gallium arsenide.

Figure 1:
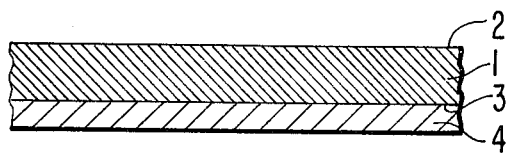
FIGS. 1 to 8 are sectional views showing the steps of manufacturing a plurality of semiconductor devices having a copper heat capacitor and copper heat sink.

FIG. 1 illustrates a wafer 1 of semiconductor material such as silicon. The semiconductor wafer 1 has been doped with substances necessary to form the desired devices. Metal films 2 and 3 are deposited on both sides of the semiconductor wafer 1, using standard deposition techniques such as for example, vacuum, deposition, sputtering, or ion beam. These metal films 2 and 3 can be a mixture of titanium-palladium-gold, chrome-gold or any metallic substance which forms a good bond with the surface of the semiconductor wafer 1. The thickness of films 2 and 3 is typically on the order of 4000A (angstroms).

Figure 2:
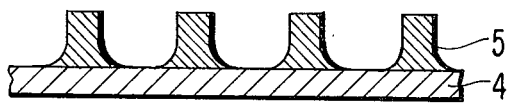

A conductive support 4 is deposited on the metal film 3 on one side of the semiconductor wafer 1. The conductive support should be inert with respect to the etchants employed in subsequent steps of the present process. This conductive support 4, preferably gold or platinum, may be produced by electroplating. The metal film 2 can be protected by a layer as of wax or micro stop (not shown). The thickness of the conductive support, hereafter referred to as a gold support, is typically on the order of 0.5 mil (12.7 microns). The protective layer is now removed from the thin film 2 and a layer of photosensitive masking material is applied to the thin film using standard photoresist application techniques. Typically, this layer has a thickness on the order of about 0.1 to 2 mils (2 to 50 microns). The photosensitive layer is exposed to light using a suitable mask. The photosensitive masking material is developed and the undesired material is washed away. Thereafter, diodes are produced by etching the semiconductor material in the areas not coated with masking material to provide a plurality of diodes 5 on a gold support as seen in FIG. 2. The thin layer of photosensitive masking material (not shown) above the diodes need not be removed.

Figure 3:
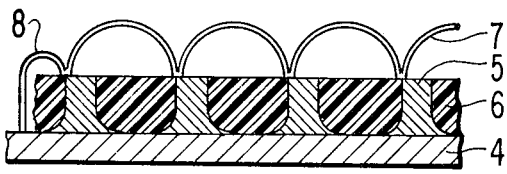

In the next step of operation, a photosensitive masking material, e.g. a standard positive photoresist 6, is applied up to (as shown) or slightly over the height of the diodes over the diode side of the gold support. Windows are opened by conventional techniques in the photoresist 6 above each diode 5. A gold wire 7 is attached from near the edge of each diode 5, to a neighboring diode 5, e.g. by ultrasonic bonding, although any conventional bonding technique should suffice, as that each diode 5 is electrically connected in parallel to all of said diodes 5. A gold wire 8 is interconnected between one of said diodes 5 and said gold support 4. A window may have been opened into the photoresist 6 to provide access for this gold wire 8 or alternatively, the gold wire 8 may be attached to the edge of the gold support 4. This results in the device shown in FIG. 3.

Figure 4:
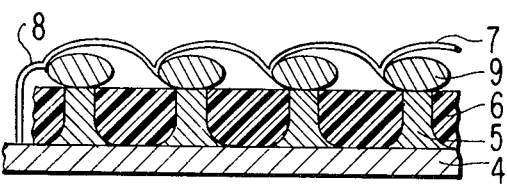

In FIG. 4, a copper heat capacitor 9 has been electrolytically or non-electrolytically deposited upon each of the diodes 5. This heat capacitor 9 can be of any convenient thickness, e.g. 0.5 mil (12.7 microns). When a "stop plate" film has been deposited on the gold support 4 prior to the copper deposition, the resultant device is seen in FIG. 4. The copper heat capacitor 9, as a result of surface tension, has an eliptical configuration. The copper heat capacitor 9 can have a cylindrical configuration determined by the height of the photoresist 6, above the top of the semiconductor diode 5, which photoresist constricts the normal growth of the heat capacitor.

Figure 5:
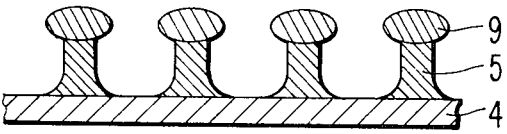

In FIG. 5, the now copper plated gold wires 7 and 8 have been broken away from the copper heat capacitor 9 and the photoresist 6 has been removed. The photoresist 6 and the stop plate can conveniently be removed by dissolving in a suitable solvent, such as acetone. Obviously the photoresist can be removed prior to removal of the gold wires 7 and 8. The gold support 4 can be severed either by breaking or etching to form a plurality of semiconductor diodes 5 on a gold support 4 each of which has a copper heat capacitor 9 on top of said diode.

Figure 6:
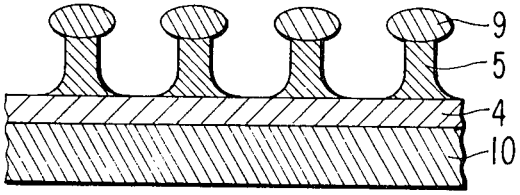

When a heat sink is to be formed, the diode side of the gold support 4 is now covered with a stop plate solution. A copper layer 10 of desired thickness is next plated onto the gold support 4 to result in the device shown in FIG. 6. Alternatively, had no stop plate solution been deposited on gold support 4 in the description of FIG. 4, then when the copper heat capacitor is deposited, a corresponding thickness of copper would have been deposited on the backside of the device, to result again in the configuration shown in FIG. 6. Since frequently, it is desirable to have a heat sink of a thickness on the order of about 5 mils (127 microns), and a heat capacitor is on the order of about 0.5 mils (12.7 microns) in thickness, a separate plating step is necessary to provide a thicker layer.

Figure 7:
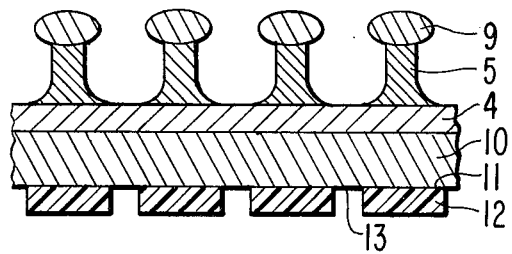

In FIG. 7, a protective gold flash layer 11 of about 200A has been flashed upon the copper layer 10 as a protective contact layer. This gold flash layer may be omitted together with the subsequent step of etching the same if the protective contact layer is not desired. A photoresist layer 12 has been deposited upon the gold flash layer 11 and intersecting stripes 13 have been opened into the photoresist layer 12 aligned around each diode 5.

Figure 8:
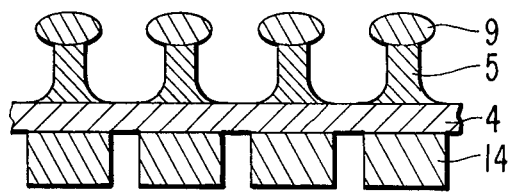

The gold flash layer 11 is now removed in the exposed stripes 13 and the exposed layer 10 is etched away down to the gold support 4 to form an individual copper heat sink 14 below each diode 5 as seen in FIG. 8. Aqueous hydrochloric acid is a suitable etchant for copper although any other effective etching solution may be used.

Figure 9:
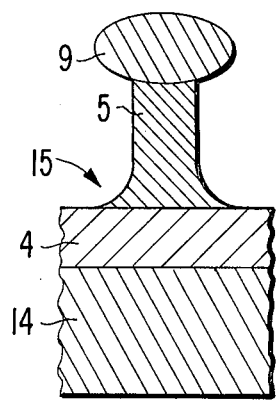
FIG. 9 is a sectional view of a semiconductor diode having a heat capacitor and heat sink prepared in accordance with the process steps of FIGS. 1 to 8.

The photoresist layer and the stop plate solution are now removed by dipping the gold support, having thereon a plurality of semiconductor diodes 5 each of which has a copper heat capacitor 9 and a heat sink 14, into a suitable solvent, such as acetone. The gold support layer is now severed, where the intersecting stripes 13 had been, to form individual semiconductor devices 15. FIG. 9 shows a completed device 15, which comprises a semiconductor diode 5 on a gold support 4 with a copper heat capacitor 9, over the diode 5 and a copper heat sink 14 on the backside of the support 4.

Alternatively, the copper heat sink could have been produced in the manner described in U.S. Pat. No. 3,897,627 to Klatskin, the pertinent portions of which patent are incorporated herein by reference. Briefly, one having the device of FIG. 5 before him would deposit a stop plate solution over the diodes 5 and a thick photoresist layer on the backside of the gold support 4. Thereafter windows would be etched into the photoresist layer below each diode 4. After development of the photoresist, a copper heat sink would be plated onto the exposed areas using standard electroplating techniques. The thickness of the copper would be substantially equal to the depth of the developed photoresist layer. Removal of the photoresist and the stop plate solution would again result in the device of FIG. 8.

Figure 10:
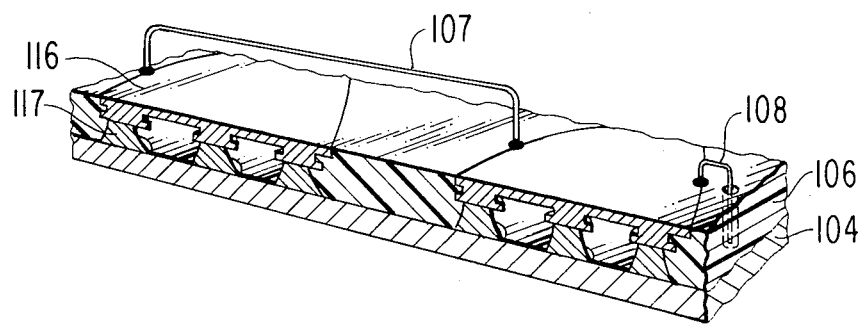
FIG. 10 is a sectional view of one step of manufacturing a copper heat capacitor on a plurality of air-bridges each of which electrically interconnects a plurality of semiconductor elements.

Although the invention has been described in particular with the production of a silicon semiconductor diode having a copper heat capacitor thereon, the same technique can be used for other products, for example, forming a copper heat capacitor, as shown in FIG. 10, on a plurality of air-bridges 116 each of which electrically interconnect a plurality of semiconductor elements 117 on a substrate, such as shown in our U.S. Pat. No. 3,932,226. Each air-bridge 116 and interconnected semiconductor elements 117 in FIG. 10 are treated as a single diode of FIG. 3. A photoresist layer 106 is deposited over the entire air-bridge side of the substrate. Windows are opened into the photoresist layer 106 over each air-bridge 116, and gold wires 107 and 108 are attached to the edge of the air-bridge 116 to electrically interconnect the air-bridge 116 in parallel with the substrate 104. A copper heat capacitor is now plated on each air-bridge 116, and the gold wires 107 and 108 and the photoresist layer 106 are removed.

A copper heat sink can be formed on a plurality of semiconductor devices, e.g. the diodes as seen in FIG. 2, without previously forming a copper heat capacitor by covering the diode side of the gold support 4 with a stop plate solution. A copper layer is now deposited on the exposed side. A gold flash layer is next flashed over the copper layer and photoresist is deposited on the gold flash layer as seen in FIG. 7. By suitable etching, as described above, a copper heat sink can be produced below each diode as seen in FIG. 8. One can now either break the support layer onto a plurality of devices each having a copper heat sink or attach gold wires as seen in FIG. 4 and continue as shown above to produce copper heat capacitors also.

We claim:

1. A method of manufacturing semiconductor devices having a copper heat capacitor which comprises:
    a. depositing a metal film on both sides of an appropriately doped semiconductor wafer;
    b. depositing a conductive support layer on said metal film on one side of said semiconductor wafer;
    c. etching said semiconductor wafer to form a plurality of semiconductor devices on said conductive support;
    d. applying a masking material over the devices on said conductive support;
    e. opening windows in said masking material above each device;
    f. attaching a gold wire near the edge of each device, so that each device is electrically connected in parallel to all of said devices and to said conductive support;

g. plating a copper heat capacitor on each device, and h. removing said gold wires and said masking material.

2. A method in accordance with claim 1, wherein said conductive support is selected from the group consisting of gold and platinum.

3. A method in accordance with claim 1, wherein said metal film is chromium gold.

4. A method in accordance with claim 2, wherein a copper heat sink is formed on the side of said conductive support opposed to said device side.

5. A method in accordance with claim 4, wherein said conductive support is severed to form a plurality of devices, each of which has a copper heat capacitor and a copper heat sink.

6. A method in accordance with claim 4, wherein said copper heat sink is formed by;

a. covering said device side of said conductive support with a stop plate solution;

b. plating a copper layer to desired thickness on said conductive support;

c. applying a masking layer on said copper layer;

d. opening intersecting stripes in said masking layer aligned around each diode;

e. etching said copper layer within said stripes of said masking layer down to said conductive support to form an individual copper heat sink below each diode;

f. removing said masking layer and said stop plate solution; and g. severing said conductive support layer where said intersecting stripes had been to form individual semiconductor devices.

7. A method in accordance with claim 6, wherein a gold flash layer is deposited in the copper layer after step (b), a masking layer is deposited on said gold flash layer, intersecting stripes are opened into said masking layer aligned around each diode, said gold flash layer is removed within said stripes and proceeding as in steps (f) to (g).

8. A method in accordance with the method of claim 1 wherein each of said semiconductor devices has an air bridge therein which electrically interconnects a plurality of semiconductor elements on the conductive substrate, wherein:

said step (d) consists of applying a masking layer over the air-bridges on said substrate;

said step (e) consists of opening windows in said masking layer above each air-bridge;

said step (f) consists of attaching a gold wire near the edge of each air-bridge, so that said air-bridge is electrically connected in parallel to all of said air-bridges and said conductive substrate;

said step (g) consists of plating a copper heat capacitor on each air-bridge; and said step (h) consists of removing said gold wire and said masking layer.

9. The method of claim 8, wherein said masking layer is photoresist.

10. A method of manufacturing semiconductor devices having a copper heat sink which comprises the steps of:

a. depositing a metal film on at least one side of an appropriately doped semiconductor wafer;

b. depositing a conductive support layer on said metal film on one side of said semiconductor wafer;

c. etching said semiconductor wafer to form a plurality of semiconductor devices on said conductive support;

d. covering said device side of said conductive support with a stop plate solution;

e. plating a copper layer to desired thickness on said conductive support;

f. applying a masking layer over said copper layer;

g. opening, in said masking layer, intersecting stripes aligned around each device;

h. etching said copper layer within said stripes of said masking layer down to said conductive support to form an individual copper heat sink below each device; and i. removing said masking layer and said stop plate solution.

11. The method of claim 10, wherein said metal film of step (a) is deposited on both sides of said wafer.

* * * * *

UNITED STATES PATENT OFFICE
CERTIFICATE OF CORRECTION

PATENT NO. : 4,080,722

DATED : March 28, 1978

INVENTOR(S) : Jerome B. Klatskin et al

It is certified that error appears in the above-identified patent and that said Letters Patent are hereby corrected as shown below:

Col. 1, line 29            "PCA" should be -- RCA --

Signed and Sealed this

Twelfth Day of September 1978

[SEAL]

Attest:

RUTH C. MASON
*Attesting Officer*

DONALD W. BANNER
*Commissioner of Patents and Trademarks*